(12) United States Patent
Xu et al.

(10) Patent No.: US 11,094,876 B2
(45) Date of Patent: Aug. 17, 2021

(54) PIEZOELECTRIC STEERING ENGINE OF BISTABLE AND CONTROL METHOD THEREOF

(71) Applicant: XI'AN JIAOTONG UNIVERSITY, Shaanxi (CN)

(72) Inventors: Minglong Xu, Shaanxi (CN); Zijian Jing, Shaanxi (CN)

(73) Assignee: XIAN JIAOTONG UNNVERSTTY, Shaanxi (CN)

( * ) Notice: Subject to any disclaimer, the term of this patent is extended or adjusted under 35 U.S.C. 154(b) by 374 days.

(21) Appl. No.: 16/312,294

(22) PCT Filed: Jun. 20, 2017

(86) PCT No.: PCT/CN2017/089244
§ 371 (c)(1),
(2) Date: Dec. 21, 2018

(87) PCT Pub. No.: WO2018/054106
PCT Pub. Date: Mar. 29, 2018

(65) Prior Publication Data
US 2019/0326504 A1  Oct. 24, 2019

(30) Foreign Application Priority Data

Sep. 26, 2016 (CN) .......................... 201610850398.7

(51) Int. Cl.
*H01L 41/09* (2006.01)
*B64C 9/06* (2006.01)
(Continued)

(52) U.S. Cl.
CPC .............. *H01L 41/094* (2013.01); *B64C 9/06* (2013.01); *B64C 9/04* (2013.01); *B64C 2027/8272* (2013.01)

(58) Field of Classification Search
CPC ... F42B 10/64; B64C 5/16; B64C 9/04; B64C 9/06; B64C 13/50
See application file for complete search history.

(56) References Cited

U.S. PATENT DOCUMENTS 5,393,011 A * 2/1995 Dunn ...................... F42B 10/64
244/3.21
5,661,260 A * 8/1997 Cho ........................ B63G 8/18
114/126
(Continued)

FOREIGN PATENT DOCUMENTS

CN 104964613 A * 10/2015

*Primary Examiner* — Christopher D Hutchens

(57) ABSTRACT

A piezoelectric steering engine of bistable includes a base, four torsion units respectively fixed on the base, and four stiffness devices respectively located at a free end of the four torsion units. The four torsion units share the same structure, and are sequentially arranged at an interval of 90° in a same plane. The four stiffness devices share the same structure and are all connected to rudder blades. Every torsion unit includes a cantilever beam, a first macro-fiber composite actuator and a second macro-fiber composite actuator both of which are respectively attached to two opposite surfaces of the cantilever beam. A first stiffness device includes an elastic ring and a bearing pad mounted inside the elastic ring. After the cantilever beam passes through the bearing pad, a torque is exerted on the cantilever beam by the elastic ring through the bearing pad, resulting in the buckling of the cantilever beam.

3 Claims, 4 Drawing Sheets

(51) Int. Cl.
  *B64C 9/04* (2006.01)
  *B64C 27/82* (2006.01)

(56) References Cited

U.S. PATENT DOCUMENTS

| | | | |
|---|---|---|---|
| 5,775,636 A * | 7/1998 | Vig | F42B 10/64 244/3.21 |
| 2015/0240659 A1* | 8/2015 | Thornburgh | B64C 27/72 416/23 |
| 2019/0118935 A1* | 4/2019 | Love | B64C 11/44 |

* cited by examiner

PIEZOELECTRIC STEERING ENGINE OF BISTABLE AND CONTROL METHOD THEREOF

CROSS REFERENCE OF RELATED APPLICATION

This is a U.S. National Stage under 35 U.S.C. 371 of the International Application PCT/CN2017/089244, filed Jun. 20, 2017, which claims priority under 35 U.S.C. 119(a-d) to CN 201610850398.7, filed Sep. 26, 2016.

BACKGROUND OF THE PRESENT INVENTION

Field of Invention

The present invention relates to the field of steering engine, and more particularly to a piezoelectric steering engine of bistable and a control method thereof.

Description of Related Arts

In recent years, with the rapid development of the aerospace field the steering engine is gradually developing in the direction of small size, light weight and strong electromagnetic compatibility. Hydraulic and pneumatically driven steering engines often have large size and complex structures. As a result, these traditional steering engines are always too large to be easily employed in micro aircraft. Piezoelectric driving method has the advantages of compact structure, small volume, high displacement resolution, high positioning accuracy, fast response. However, the piezoelectric materials are limited in their small deformation range for their applications in steering engine.

SUMMARY OF THE PRESENT INVENTION

In order to solve the problems of the traditional steering engine with large size and complicated structure an object of the present invention is to provide a piezoelectric steering engine of bistable and a control method thereof. Through the controlled switchover between the buckling modes of the cantilever beams driven by piezoelectric actuators, the engine achieves the large tilting of the rudder blades, positioning maintaining function after power off, simple assembly and fast steering.

To achieve the above object, the present invention provides a technical solution as follows.

A piezoelectric steering engine of bistable comprises a base, a first torsion unit fixed on the base, a first stiffness device located at a free end of the first torsion unit, a second torsion unit, a second stiffness device located at a free end of the second torsion unit, a third torsion unit, a third stiffness device located at a free end of the third torsion unit, a fourth torsion unit, a fourth stiffness device located at a free end of the fourth torsion unit, wherein: all of the first torsion unit, the second torsion unit, the third torsion unit and the fourth torsion unit share a same structure and are sequentially arranged at an interval of 90° in a same plane; all of the first stiffness device, the second stiffness device, the third stiffness device and the fourth stiffness device share a same structure and are connected with rudder blades;

the first torsion unit comprises a cantilever beam, a first macro-fiber composite actuator and a second macro-fiber composite actuator both of which are respectively attached to two opposite surfaces of the cantilever beam; the first stiffness device comprises an elastic ring and a bearing pad mounted inside the elastic ring; the cantilever beam passes through the bearing pad, an inner diameter of the bearing pad is smaller than a width of the cantilever beam, so that after the cantilever beam is mounted inside the first stiffness device, a torque is exerted on one end of the cantilever beam by the elastic ring through the bearing pad, resulting in the buckling of the cantilever beam.

All of the first torsion unit, the second torsion unit, the third torsion unit and the fourth torsion unit, and all of the first stiffness device, the second stiffness device, the third stiffness device and the fourth stiffness device respectively located at a free end of the first torsion unit, the second torsion unit, the third torsion unit and the fourth torsion unit are mounted inside an outer cover and pass through the outer cover to be connected with the rudder blades.

An actuating method of the piezoelectric steering engine of bistable mentioned above is described in detail as follows. While being not energized, due to a pre-stress of the elastic ring, the cantilever beam is in a first unstable deflection state and has a deflection angle of $\alpha$; in an initial state, a half full-scale voltage is simultaneously applied to the first macro-fiber composite actuator and the second macro-fiber composite actuator, and at this time the two actuators are opposite to each other, two corresponding torques are offset from each other, the cantilever beam remains in the first unstable deflection state. When it is required to control the steering engine, a rising voltage is applied to the first macro-fiber composite actuator, the rising voltage is increased to a maximum control voltage, and simultaneously a falling voltage is applied to the second macro-fiber composite actuator, the falling voltage is decreased to a minimum control voltage, so that the cantilever beam is twisted and deformed, simultaneously changes from the first unstable deflection state to a second unstable deflection state, and has the deflection angle of $-\alpha$. When the deflection angle is $-\alpha$, if a falling voltage is applied to first macro-fiber composite actuator, the falling voltage is decreased to the minimum control voltage, and simultaneously a rising voltage is applied to the second macro-fiber composite actuator, the rising voltage is increased to the maximum control voltage, so that the cantilever beam is twisted and deformed, changes from the second unstable deflection state to the first unstable deflection state, and has the deflection angle of $\alpha$.

Through the method as same as the above description, all of the second torsion unit, the third torsion unit and the fourth torsion unit control the rudder blades.

Compared with the prior art, the present invention has advantages as follows.

(1) The present invention has a position maintaining function after power-off. Since the cantilever beam is always in one of two torsion unstable states due to the action of the first stiffness device, the deflection angle is always outputted even if the power is not supplied. Maintaining the position after power-off has the effect of reducing energy consumption and facilitating application, which is a common requirement in general engineering applications.

(2) The present invention constructs the engine by attaching the macro-fiber composite actuator on the cantilever beam, does not need to adopt any hydraulic and pneumatic sealing device, and does not need to adopt the speed reducer, and has the characteristics of simple structure, small volume and light weight.

(3) The present invention adopts a piezoelectric driving method to control the steering engine. The piezoelectric driving method has no stray magnetic field and has strong

DETAILED DESCRIPTION OF THE PREFERRED EMBODIMENT

The present invention is further described in detail with accompanying drawings and embodiments as follows.

Figure 1:
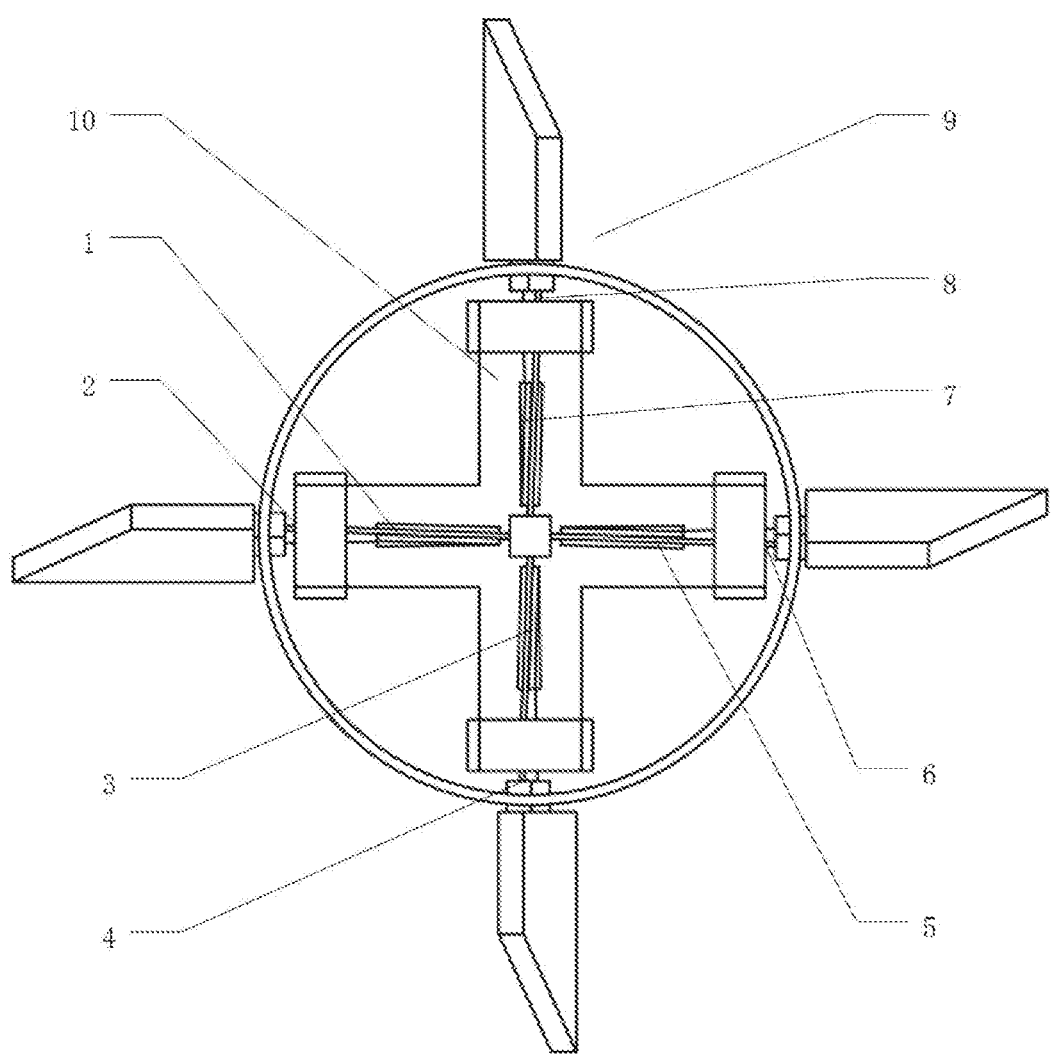
FIG. 1 is a stereogram of a piezoelectric steering engine of bistable provided by the present invention.

As shown in FIG. 1, a piezoelectric steering engine of bistable provided by the present invention comprises a base 10, a first torsion unit 1 fixed on the base 10, a first stiffness device 2 located at a free end of the first torsion unit 1, a second torsion unit 3, a second stiffness device 4 located at a free end of the second torsion unit 3, a third torsion unit 5, a third stiffness device 6 located at a free end of the third torsion unit 5, a fourth torsion unit 7, a fourth stiffness device 8 located at a free end of the fourth torsion unit 7, wherein: all of the first torsion unit 1, the second torsion unit 3, the third torsion unit 5 and the fourth torsion unit 7 share a same structure, are sequentially arranged at an interval of 90° in a same plane; all of the first stiffness device 2, the second stiffness device 4, the third stiffness device 6 and the fourth stiffness device 8 share a same structure and are connected with rudder blades.

Figure 2A:
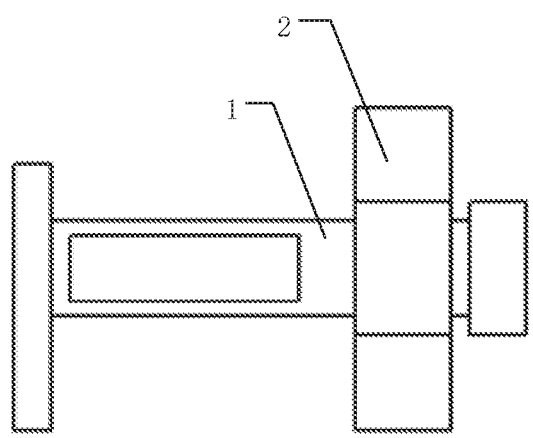
FIG. 2a is an assembled diagram of a first torsion unit and a first stiffness device.
Figure 2B:
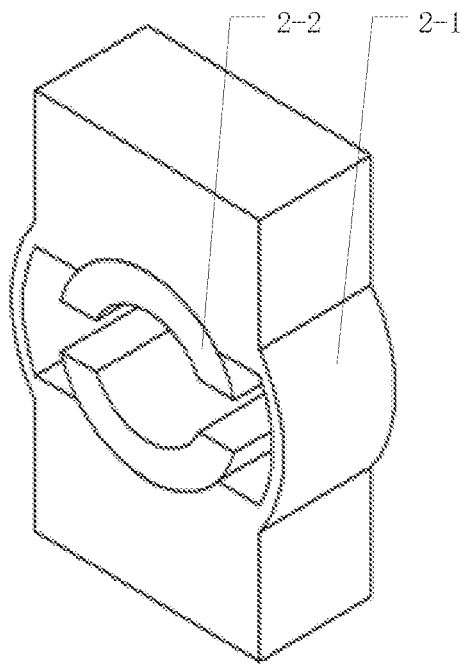
FIG. 2b is a structurally schematic view of the first stiffness device.
Figure 2C:
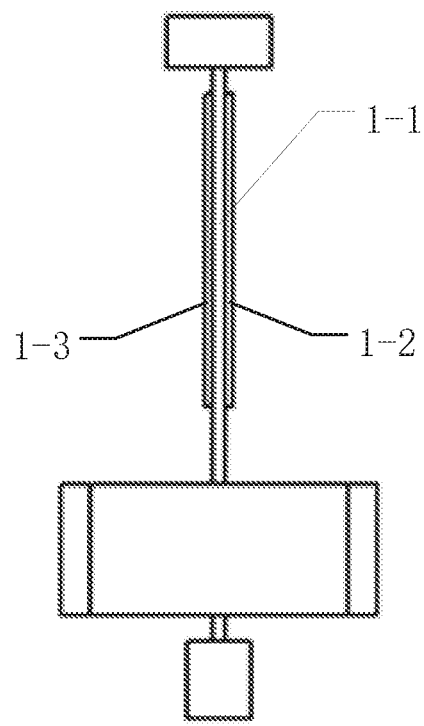
FIG. 2c is a structurally schematic view of the first torsion unit.

As shown in FIGS. 2a, 2b and 2c, the first torsion unit 1 comprises a cantilever beam 1-1, a first MFC (macro-fiber composite) actuator 1-2 and a second macro-fiber composite actuator 1-3 both of which are respectively attached to two opposite surfaces of the cantilever beam 1-1; the first stiffness device 2 comprises an elastic ring 2-1 and a bearing pad 2-2 mounted inside the elastic ring 2-1; the cantilever beam 1-1 passes through the bearing pad 2-2, an inner diameter of the bearing pad 2-2 is smaller than a width of the cantilever beam 1-1, so that after the cantilever beam 1-1 is mounted inside the first stiffness device 2, a torque is exerted on one end of the cantilever beam 1-1 by the elastic ring 2-1 through the bearing pad 2-2, resulting in the buckling of the cantilever beam 1-1. After the buckling, the cantilever beam has two stable states, namely, a deflection angle of the cantilever beam after being twisted is $\alpha$ or $-\alpha$.

An actuating method of the present invention is described in detail as follows.

Figure 3A:
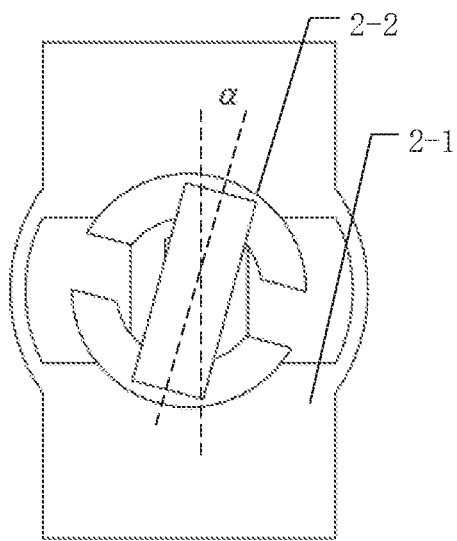
FIG. 3a is a schematic view of the first torsion unit in a first unstable deflection state.
Figure 3B:
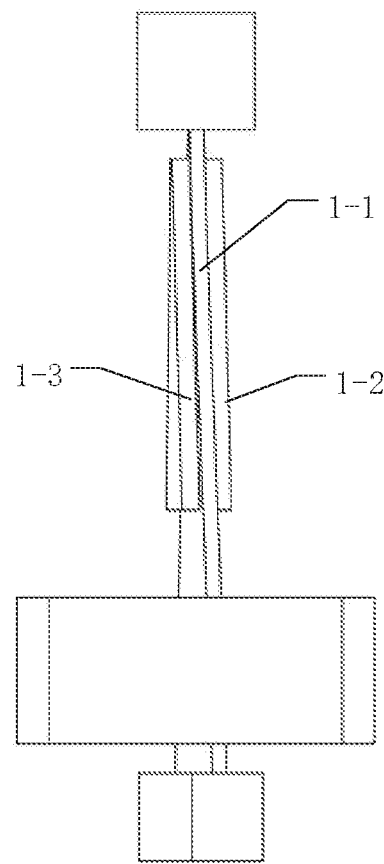
FIG. 3b is a top view of the first torsion unit in the first unstable deflection state.
Figure 4A:
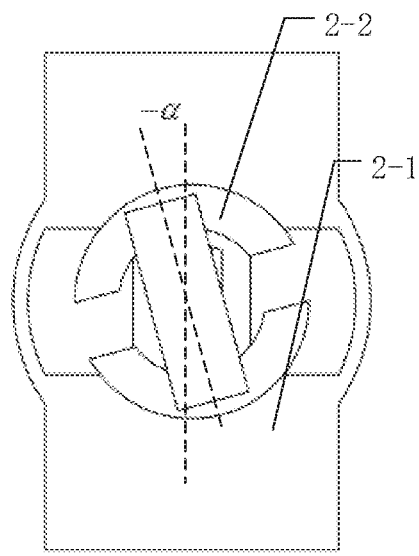
FIG. 4a is a schematic view of the first torsion unit in a second unstable deflection state.
Figure 4B:
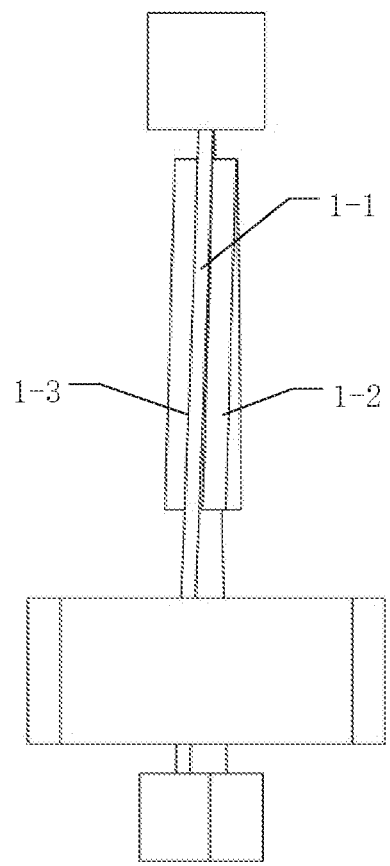
FIG. 4b is a top view of the first torsion unit in the second unstable deflection state.

While being not energized, as shown in FIGS. 3a and 3b, due to the pre-stress of the elastic ring 2-1, the cantilever beam 1-1 is in a first unstable deflection state and has a deflection angle of $\alpha$; in an initial state, a half full-scale voltage is simultaneously applied to the first macro-fiber composite actuator 1-2 and the second macro-fiber composite actuator 1-3, and at this time the two actuators are opposite to each other, two corresponding torques are offset from each other, the cantilever beam 1-1 remains in the first unstable deflection state. When it is required to control the steering engine, a rising voltage is applied to the first macro-fiber composite actuator 1-2, the rising voltage is increased to a maximum control voltage, and simultaneously a falling voltage is applied to the second macro-fiber composite actuator 1-3, the falling voltage is decreased to a minimum control voltage, so that the cantilever beam 1-1 is twisted and deformed, simultaneously changes from the first unstable deflection state to a second unstable deflection state, and has the deflection angle of $-\alpha$, as shown in FIGS. 4a and 4b. When the deflection angle is $-\alpha$, if a falling voltage is applied to first macro-fiber composite actuator 1-2, the falling voltage is decreased to the minimum control voltage, and simultaneously a rising voltage is applied to the second macro-fiber composite actuator 1-3, the rising voltage is increased to the maximum control voltage, so that the cantilever beam 1-1 is twisted and deformed, changes from the second unstable deflection state to the first unstable deflection state, and has the deflection angle of $\alpha$.

Through the method as same as the above description, all of the second torsion unit 3, the third torsion unit 5 and the fourth torsion unit 7 are able to control the rudder blades.

What is claimed is:

1. A piezoelectric steering engine, which comprises: a base (10), a first torsion unit (1) fixed on the base (10), a first stiffness device (2) located at a free end of the first torsion unit (1), a second torsion unit (3), a second stiffness device (4) located at a free end of the second torsion unit (3), a third torsion unit (5), a third stiffness device (6) located at a free end of the third torsion unit (5), a fourth torsion unit (7), a fourth stiffness device (8) located at a free end of the fourth torsion unit (7), wherein: all of the first torsion unit (1), the second torsion unit (3), the third torsion unit (5) and the fourth torsion unit (7) are same in structure and are sequentially arranged at an interval of 90° in a same plane; all of the first stiffness device (2), the second stiffness device (4), the third stiffness device (6) and the fourth stiffness device (8) are same in structure and are connected with rudder blades;

the first torsion unit (1) comprises a cantilever beam (1-1), a first macro-fiber composite actuator (1-2) and a second macro-fiber composite actuator (1-3) both of which are respectively attached to two opposite surfaces of the cantilever beam (1-1); the first stiffness device (2) comprises an elastic ring (2-1) and a bearing pad (2-2) mounted inside the elastic ring (2-1); the cantilever beam (1-1) passes through the bearing pad (2-2), an inner diameter of the bearing pad (2-2) is smaller than a width of the cantilever beam (1-1), so that after the cantilever beam (1-1) is mounted inside the first stiffness device (2), a torque is exerted on one end of the cantilever beam (1-1) by the elastic ring (2-1) through the bearing pad (2-2), resulting in buckling of the cantilever beam (1-1).

2. The piezoelectric steering engine according to claim 1, wherein: all of the first torsion unit, the second torsion unit, the third torsion unit, the fourth torsion unit, the first stiffness device, the second stiffness device, the third stiffness device and the fourth stiffness device are mounted inside an outer cover (9) and pass through the outer cover (9) to be connected with the rudder blades.

3. A control method of the piezoelectric steering engine according to claim 1, the method comprising:

while the piezoelectric steering engine is not energized, enabling the cantilever beam (1-1) to be in a first unstable deflection state by the elastic ring (2-1) applying a pre-stress to the cantilever beam (1-1), wherein the cantilever beam (1-1) is deflected by an angle which is defined as $\alpha$;

in an initial state, simultaneously applying a half full-scale voltage to the first macro-fiber composite actuator (1-2) and the second macro-fiber composite actuator (1-3) which is opposite to the first macro-fiber composite actuator (1-2), offsetting a torque of the first macro-fiber composite actuator (1-2) with a torque of the second macro-fiber composite actuator (1-3), remaining the cantilever beam (1-1) in the first unstable deflection state;

while the piezoelectric steering engine needs to be controlled, twisting and deforming the cantilever beam (1-1) by applying a rising voltage to the first macro-fiber composite actuator (1-2), increasing the rising voltage to a maximum control voltage, simultaneously applying a falling voltage to the second macro-fiber composite actuator (1-3), and decreasing the falling voltage to a minimum control voltage, and then changing the cantilever beam (1-1) from the first unstable deflection state to a second unstable deflection state, wherein the cantilever beam (1-1) is deflected by an angle which is defined as $-\alpha$;

when the cantilever beam (1-1) is deflected by the angle of $-\alpha$, twisting and deforming the cantilever beam (1-1) by applying the falling voltage to the first macro-fiber composite actuator (1-2), decreasing the falling voltage to the minimum control voltage, simultaneously applying the rising voltage to the second macro-fiber composite actuator (1-3), increasing the rising voltage to the maximum control voltage, and then changing the cantilever beam (1-1) from the second unstable deflection state to the first unstable deflection state, wherein the cantilever beam (1-1) is deflected by the angle of $\alpha$.

\* \* \* \* \*